United States Patent [19]

Malka et al.

[11] Patent Number: 4,633,191

[45] Date of Patent: Dec. 30, 1986

[54] TRANSFORMER ISOLATED HIGH VOLTAGE, HIGH POWER AMPLIFIER SYSTEM

[75] Inventors: Jacob H. Malka, Fair Lawn; Philip J. Thurakal, New Milford, both of N.J.

[73] Assignee: Allied Corporation, Morris Township, Morris County, N.J.

[21] Appl. No.: 768,272

[22] Filed: Aug. 22, 1985

[51] Int. Cl.$^4$ .............................................. H03F 1/26
[52] U.S. Cl. ..................................... 330/275; 330/149; 330/195
[58] Field of Search ............... 330/149, 195, 208, 209, 330/274, 276

[56] References Cited

U.S. PATENT DOCUMENTS 3,831,102  8/1974  Medal ................................. 330/276

Primary Examiner—Gene Wan
Attorney, Agent, or Firm—Howard G. Massung; Anthony F. Cuoco

[57] ABSTRACT

A transformer isolated high voltage, high power system is disclosed which is suitable for driving servo motors in servo loop control systems or the like. A D.C. current control loop is provided for preventing transformer saturation without gapping the transformer core. An output control loop is provided which minimizes signal crossover distortion and input/output phase shift. Crossover distortion adjustment is also implemented.

14 Claims, 1 Drawing Figure

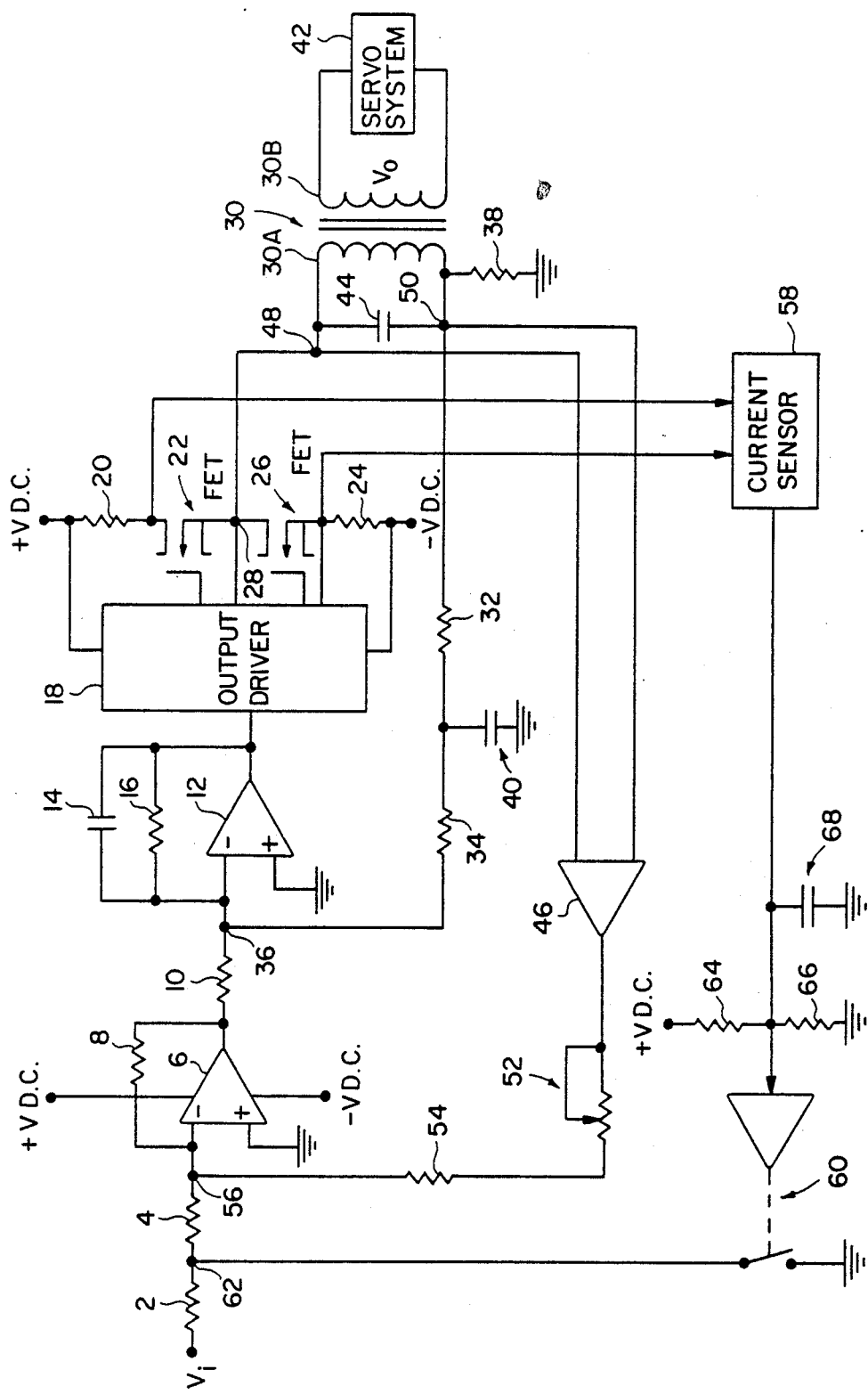

4,633,191

TRANSFORMER ISOLATED HIGH VOLTAGE, HIGH POWER AMPLIFIER SYSTEM

BACKGROUND OF THE INVENTION

Transformer isolated high voltage, high power amplifier systems capable of effectively driving loads such as, for example, servo motors, without transformer core gapping are not commonly available. Prior art amplifier systems use an A.C. coupled input signal to prevent undesirable transformer saturation. However, this arrangement does not remove the signal's D.C. component due to output stage offset, thereby necessitating gapping the transformer core and complicating the system. The prior art systems also use a capacitor in series with the transformer primary winding to prevent the aforenoted saturation. In high power applications this arrangement is not practical due to the size of the capacitor required.

At relatively low output voltage levels phase shift and cross over signal distortion can occur. Output control loops used to accommodate this distortion cause high signal unbalance in positive and negative half-cycle signal areas.

Accordingly, it is an object of the present invention to overcome the aforenoted disadvantages of prior art transformer isolated high voltage, high power amplifier systems and to provide a system which is simple in construction and has a reduced number of components.

SUMMARY OF THE INVENTION

This invention contemplates a transformer isolated high voltage, high power amplifier system featuring a pair of control loops.

A first D.C. current loop prevents transformer saturation without gapping the transformer core by monitoring the transformer primary current using a discrete differential amplifier arrangement. The control loop includes an error amplification stage which corrects for and minimizes output voltage waveform distortion. Feedback generated from a transformer primary winding current sensing resistor corrects for the transformer D.C. current.

A second output control loop features a field effect transistor (FET) drive circuit having the capability of sourcing and sinking current at any output voltage level. The use of field effect transistors in the output control loop enables low drive power dissipation and minimizes breakdown problems associated with bipolar transistors.

BRIEF DESCRIPTION OF THE DRAWING

The single FIGURE in the drawing is a combination block diagram - electrical schematic of a transformer isolated high voltage, high power amplifier system according to the invention.

DETAILED DESCRIPTION OF THE INVENTION

An input signal $V_i$ is applied through resistors 2 and 4 to the inverting (−) input terminal of an operational amplifier 6 having a grounded noninverting (+) input terminal. Amplifier 6 is connected to suitable positive (+V) and negative (−V) D.C. voltage sources. A resistor 8 is connected in feedback relation to the output terminal of amplifier 6 and to the inverting input terminal thereof.

The output terminal of amplifier 6 is connected through a resistor 10 to the inverting (−) input terminal of an operational amplifier 12 having a grounded noninverting (+) input terminal. A feedback circuit including a capacitor 14 in parallel with a resistor 16 is connected to the output terminal of amplifier 12 and to the inverting input terminal thereof. The output terminal of amplifier 12 is connected to an output driver 18 which may be a fixed gain amplifier.

A positive (+V) source of D.C. voltage is connected to output driver 18 and is connected through a resistor 20 to a field effect transistor (FET) 22. A negative (−V) source of D.C. voltage is connected to output driver 18 and is connected through a resistor 24 to a field effect transistor (FET) 26. Field effect transistors 22 and 26 are connected at a circuit point 28 which, in turn, is connected to output driver 18.

Circuit point 28 is connected to the input leg of a primary winding 30A of a transformer 30. The output leg of transformer primary winding 30A is connected through a resistor 32 and a resistor 34 to a circuit point 36 between resistor 10 and the inverting input terminal of operational amplifier 12. Transformer primary winding 30A is grounded through a resistor 38 connected to its output leg. A grounded capacitor 40 is connected between resistors 32 and 34.

Transformer 30 includes a secondary winding 30B inductively coupled to primary winding 30A. Secondary winding 30B provides an output voltage $V_o$ for driving a load such as a servo motor in a servo system 42. A capacitor 44 is connected across primary transformer winding 30A.

A differential amplifier 46 is connected at a circuit point 48 between circuit point 28 and the input leg of transformer primary winding 30A, and is connected at a circuit point 50 connected to the output leg of transformer primary winding 30A and to capacitor 44. Differential amplifier 46 is connected through a potentiometer 52 and a resistor 54 to a circuit point 56 between resistor 4 and the inverting input terminal of operational amplifier 6.

Field effect transistors 22 and 26 are connected to a current sensor 58. Current sensor 58 is connected to an analog switch 60, and which analog switch 60 is connected to a circuit point 62 between resistors 2 and 4.

A resistor arrangement including a resistor 64 connected to a suitable positive (+V) D.C. voltage source and a grounded resistor 66 is connected between the output of current sensor 58 and the input of analog switch 60. A grounded capacitor 68 is connected between the resistor arrangement including resistors 64 and 66 and the output of current sensor 58.

OPERATION OF THE INVENTION

The gain of the amplifier system herein described is controlled by the primary voltage feedback from transformer 30 taken from primary winding 30A through differential amplifier 46. This gain is adjustable to a desired range using potentiometer 52.

Approximately zero voltage is maintained at the inverting input terminal of operational amplifier 6 by employing error amplification through operational amplifiers 6 and 12 and output driver 18. Feedback through resistors 32, 34, capacitor 40, operational amplifier 12, output driver 18 and differential amplifier 46 controls the D.C. current in transformer primary winding 30A to approximately zero amperes. Thus, a D.C. current control loop is provided which maintains substantially zero D.C. voltage drop across resistor 38 which is a sensing or sampling resistor.

In this connection it is noted, that the tendency of a saturating transformer is to produce unsymmetrical current waveforms. The aforenoted D.C. current control loop shifts the differential primary voltage waveform up or down with respect to ground to cancel out this current unbalance and to thereby prevent transformer saturation. Operational amplifier 12 and its associated circuitry is used to sum the D.C. current from the current control loop. This results in a simplified system architecture with a minimum component count and precludes transformer core gapping.

Resistors 20 and 24 are current sensing resistors in a current limiting arrangement. In this connection it is noted that recycling type current limiting is employed. A fast shutdown delay time is achieved by directly coupling a shutdown signal output from current sensor 58 using resistors 64 and 66 and capacitor 68.

Current sensor 58 is of the open collector type. Thus, if a short circuit occurs and the source of the short circuit disappears the configuration of the invention recovers from the short circuit during the next recycle. A simplified but effective arrangement is thereby provided for rapidly controlling the system current to very low average D.C. values. The aforenoted recycling prevents latch up during system start up. Current limit shutdown is achieved by shorting circuit point 62, which is the junction of resistors 2 and 4, to ground using analog switch 60. An output control loop is thus provided.

Output driver 18 incorporates a crossover adjustment circuit of the type known in the art and field effect transistors 22 and 26 are utilized to drive primary winding 30A of transformer 30. The parallel arrangement of capacitor 14 and resistor 16 in feedback relation with operational amplifier 12 provides an integration function for the output control loop and for the current control loop.

In this regard it is noted that the current control loop implements another integration through resistor 32 and capacitor 40 for the current sensed or sampled by resistor 38.

There has thus been described an amplifier system which has been found to have the capability of delivering, for example, 115 volts RMS at 110 voltamperes with a frequency range of 400 to 1125 Hz. at a signal amplificiation factor of 16.2. The invention features output transformer isolation, and a current sourcing or sinking capability at any output voltage level is implemented whereby the invention is suitable to drive servo motors in servo loop control system applications or the like.

With the aforegoing description of the invention in mind, reference is had to the claims appended hereto for a definition of the scope of the invention.

What is claimed is:

1. A transformer isolated high voltage, high power amplifier system, characterized by:
    amplifief means for receiving a system input signal and for providing an output signal;
    driver means connected to the amplifier means and responsive to the output signal for providing a driver signal;
    a transformer including a primary winding connected to the driver means for receiving the driver signal and a secondary winding for providing a system output signal;
    first means connected to the transformer primary winding and to the amplifier means for preventing saturation of the transformer; and
    second means connected to the driver means and to the amplifier means for minimizing input/output signal crossover and phase shift.

2. A system as described by claim 1, further characterized by:
    a load connected to the transformer secondary winding and driven by the output signal provided thereby.

3. A system as described by claim 1, wherein the amplifier means is characterized by:
    a first operational amplifier for receiving the system input signal;
    a second operational amplifier connected to the first operational amplifier for providing the output signal;
    the driver means connected to the second operational amplifier and responsive to the output signal for providing the driver signal;
    the transformer primary winding having an input leg connected to the driver means for receiving the driver signal; and
    the first means connected to the input leg and to an output leg of the transformer primary winding and connected to the first and second operational amplifiers for controlling the transformer primary winding current to substantially zero, whereby saturation of the transformer is prevented.

4. A system as described by claim: 3, wherein the first means connected to the input and output legs of the transformer primary winding and connected to the first and second operational amplifiers is characterized by:
    a first resistor connected to the output leg of the transformer primary winding;
    a second resistor connected to the first resistor and to the second operational amplifier;
    a grounded capacitor connected between the first and second resistors; and
    a differential amplifier connected to the input and output legs of the transformer primary winding and to the first operational amplifier.

5. A system as described by claim 4, further characterized by:
    a grounded sensing resistor connected to the output leg of the transformer primary winding, with the voltage drop across said sensing resistor being substantially zero.

6. A system as described by claim 4 further characterized by:
    means connected to the differential amplifier and to the first operational amplifier and adjustable for adjusting the gain of the system.

7. A system as described by claim 3, wherein the second means is characterized by:
    a first current sensing resistor and a second current sensing resistor connected in current limiting arrangement to the driver means;
    first current flow control means connected to the first current sensing resistor and second current flow control means connected to the second current sensing resistor;
    the driver means connected to the first and second current flow control means at a point therebetween, and the input leg of the transformer primary winding connected to said point;

current sensing means connected between the first current sensing resistor and the first current flow control means, and connected between the second current sensing resistor and the second current flow control means; and means connected to the current sensing means and to the first operational amplifier for limiting system input current to minimize input/output signal crossover and phase shift.

8. A system as described by claim 7, wherein the means connected to the current sensing means and to the first operational amplifier is characterized by:

a first input resistor for receiving the system input signal;

a second input resistor serially connected to the first input resistor; and switching means connected to the current sensing means and connected at a point between the first and second input resistors, and operable by the current sensing means for shorting said point to ground.

9. A system as described by claim 3, further characterized by:

integrating means including a resistor and a capacitor connected in parallel with the resistor, said integrating means connected in feedback relation to the second operational amplifier.

10. A system as described by claim 3, further characterized by:

other integrating means including a resistor connected to the output leg of the transformer primary winding and connected to the second operational amplifier, and further including a grounded capacitor connected between said resistor and said second operational amplifier.

11. A transformer isolated high voltage, high power amplifier system characterized by:

a transformer including a primary winding for receiving an input signal and a secondary winding for providing a system output signal;

a first operational amplifier for receiving a system input signal;

a second operational amplifier connected to the first operational amplifier;

driver means connected to the second operational amplifier and to an input leg of the transformer primary winding;

means connected to the input leg and to an output leg of the transformer primary winding and connected to the first and second operational amplifiers for controlling the transformer primary winding current to substantially zero, whereby saturation of the transformer winding is prevented;

a first current sensing resistor and a second current sensing resistor connected in current limiting arrangement to the driver means;

first current flow control means connected to the first current sensing resistor and second current flow control means connected to the second current sensing resistor;

the driver means connected to the first and second current flow control means at a point therebetween, and the input leg of the transformer primary winding connected to said point;

current sensing means connected between the first current sensing resistor and the first current flow control means, and connected between the second current sensing resistor and the second current flow control means; and means connected to the current sensing means and to the first operational amplifier for limiting system input current to minimize input/output signal crossover and phase shift.

12. A system as described by claim 11, further characterized by:

a load connected to the transformer secondary winding and driven by the output signal provided thereby.

13. A transformer isolated high voltage, high power amplifier system, characterized by:

amplifier means for receiving a system input signal and for providing an output signal;

driver means connected to the amplifier means and responsive to the output signal for providing a driver signal;

a transformer including a primary winding connected to the driver means for receiving the driver signal and a secondary winding for providing a system output signal; and means connected to the transformer primary winding and to the amplifier means for preventing saturation of the transformer.

14. A transformer isolated high voltage, high power amplifier system, characterized by:

amplifier means for receiving a system input signal and for providing an output signal;

driver means connected to the amplifier means and responsive to the output signal for providing a driver signal;

a transformer including a primary winding connected to the driver means for receiving the driver signal and a secondary winding for providing a system output signal; and means connected to the driver means and to the amplifier means for minimizing input/output signal crossover and phase shift.

* * * * *